United States Patent
Koda et al.

(10) Patent No.: US 8,450,752 B2
(45) Date of Patent: May 28, 2013

(54) SEMICONDUCTOR DEVICE AND METHOD OF MANUFACTURING THE SAME

(75) Inventors: Rintaro Koda, Tokyo (JP); Takahiro Arakida, Kanagawa (JP); Yuji Masui, Kanagawa (JP); Tomoyuki Oki, Kanagawa (JP)

(73) Assignee: Sony Corporation, Tokyo (JP)

( * ) Notice: Subject to any disclaimer, the term of this patent is extended or adjusted under 35 U.S.C. 154(b) by 112 days.

(21) Appl. No.: 12/929,515

(22) Filed: Jan. 31, 2011

(65) Prior Publication Data

US 2011/0122910 A1 May 26, 2011

Related U.S. Application Data

(62) Division of application No. 12/081,354, filed on Apr. 15, 2008, now Pat. No. 7,880,178.

(30) Foreign Application Priority Data

Apr. 19, 2007 (JP) ................................ 2007-110512

(51) Int. Cl.
*H01L 31/12* (2006.01)

(52) U.S. Cl.
USPC 257/84; 257/82; 257/E33.077; 257/E33.076; 372/50.21

(58) Field of Classification Search
USPC ............. 372/50.21; 257/81, 82, 84, E33.076, 257/E33.077
See application file for complete search history.

(56) References Cited

U.S. PATENT DOCUMENTS

| 6,005,262 A * | 12/1999 | Cunningham et al. .......... 257/84 |
| 6,693,268 B2 | 2/2004 | Wang |
| 2003/0173602 A1 | 9/2003 | Hsu et al. |
| 2004/0007709 A1 * | 1/2004 | Kondo ............................ 257/80 |
| 2004/0178415 A1 | 9/2004 | Hsu et al. |
| 2006/0146904 A1 * | 7/2006 | Guenter et al. ........... 372/50.124 |
| 2007/0081568 A1 * | 4/2007 | Imai .......................... 372/38.09 |

FOREIGN PATENT DOCUMENTS

| JP | 06-23011 | 6/1994 |
| JP | 07-1812 | 1/1995 |
| JP | 08-181381 A | 7/1996 |
| JP | 11-121878 A | 4/1999 |
| JP | 2002-057283 A | 2/2002 |
| JP | 2002-198502 A | 7/2002 |
| JP | 2006-064481 A | 3/2006 |

OTHER PUBLICATIONS

Japanese Office Action issued Sep. 7, 2011 for corresponding Japanese Application No. 2007-110512.

* cited by examiner

*Primary Examiner* — Calvin Lee
*Assistant Examiner* — Scott Stowe
(74) *Attorney, Agent, or Firm* — Rader, Fishman & Grauer PLLC

(57) ABSTRACT

The present invention provides a semiconductor device realizing reduced occurrence of a defect such as a crack at the time of adhering elements to each other. The semiconductor device includes a first element and a second element adhered to each other. At least one of the first and second elements has a pressure relaxation layer on the side facing the other of the first and second elements, and the pressure relaxation layer includes a semiconductor part having a projection/recess part including a projection projected toward the other element, and a resin part filled in a recess in the projection/recess part.

22 Claims, 13 Drawing Sheets

SEMICONDUCTOR DEVICE AND METHOD OF MANUFACTURING THE SAME

CROSS REFERENCE TO RELATED APPLICATIONS

This is a Divisional Application of patent application Ser. No. 12/081,354, filed Apr. 15, 2008, which claims priority from Japanese Patent Application JP 2007-110512 filed in the Japanese Patent Office on Apr. 19, 2007, the entire contents of which being incorporated herein by reference.

BACKGROUND OF THE INVENTION

1. Field of the Invention

The present invention relates to a semiconductor device having a plurality of elements stacked and a method of manufacturing the same.

2. Description of the Related Art

Hitherto, in a semiconductor device for a use of an optical fiber, an optical disk, and the like, as part of an object of making the light output level of a semiconductor light emitting element assembled in the device constant, emission light of the light emitting element is detected by a light detecting mechanism. The light detecting mechanism may be constructed by, for example, a reflector that branches part of emission light and a light detecting element that detects the branched emission light. In the configuration, however, the number of parts increases and, moreover, a disadvantage occurs such that the reflector and the light detecting element have to be disposed with high precision with respect to the light emitting element. As one of measures solving such a disadvantage, the light emitting element and the light detecting element are integrally formed.

However, when the light emitting element and the light detecting element are formed integrally, there is the possibility that the light detecting element detects not only stimulated emission light to be inherently detected but also spontaneous emission light. In such a case, the light output level of the light emitting element measured on the basis of light detected by the light detecting element includes an error only by the amount of spontaneous emission light. Therefore, the method is also not suitable for uses necessitating high-precision control on the light output level.

Japanese Patent No. 2,877,785 discloses a technique of providing a control layer in a light detecting element and interrupting part of spontaneous emission light entering from a light emitting element before the light detecting element detects it.

The control layer is formed by oxidizing a part of the semiconductor material of the light detecting element. The reflectance of the oxidized semiconductor material is not so high, and the semiconductor material transmits some spontaneous emission light. It is therefore difficult to sufficiently lower the spontaneous emission light detection level of the light detecting element. There is consequently a disadvantage such that light detection precision is not sufficiently improved.

SUMMARY OF THE INVENTION

To solve the disadvantage, there is a method of providing a control layer having a light transmission part in an area corresponding to a light emission area of a light emitting element between the light emitting element and a light detecting element and metal part having high reflectance around the light transmission part, and efficiently reflecting spontaneous emission light by the metal part having high reflectance.

However, in the case of providing the control layer having such a metal part between the light emitting element and the light detecting element, the light emitting element and the light detecting element may not be formed in a lump by crystal growth on the same substrate. Consequently, usually, the light emitting element and the light detecting element are formed on different substrates. The control layer is provided on the surface of at least one of the light emitting element and the light detecting element. The light emitting element and the light detecting element are adhered to each other with the control layer in between, thereby integrally forming the light emitting element and the light detecting element.

Generally, at the time of adhering the light emitting element and the light detecting element to each other with the control layer in between, in a state where the light emitting element and the light detecting element are disposed so as to face each other and the temperature is set to be high, pressure is applied in the stack direction. However, when pressure is increased to improve adhesion between the light emitting element and the light detecting element, there is the possibility that a defect such as a crack occurs in the light emitting element and the light detecting element. When the pressure is decreased to prevent occurrence of a defect such as a crack in the light emitting element and the light detecting element, there is the possibility that adhesion between the light emitting element and the light detecting element deteriorates.

As described above, the conventional method has a disadvantage such that the yield easily deteriorates in the process of adhering the light emitting element and the light detecting element. Such a disadvantage always occurs at the time of adhering the elements to each other.

It is therefore desirable to provide a semiconductor device and a method of manufacturing the same realizing suppression of occurrence of a defect such as a crack at the time of adhering the elements to each other.

According to an embodiment of the present invention, there is provided a first semiconductor device including a first element and a second element adhered to each other. At least one of the first and second elements has a pressure relaxation layer on the side facing the other of the first and second elements, and the pressure relaxation layer includes a semiconductor part having a projection/recess part including a projection projected toward the other element, and a resin part filled in a recess in the projection/recess part.

In the first semiconductor device of the embodiment of the present invention, at least one of the first and second elements adhered to each other is provided with the pressure relaxation layer including a semiconductor part having a projection/recess part including a projection projected toward the other element, and a resin part filled in a recess in the projection/recess part. With the configuration, in a manufacturing process, at the time of adhering the elements while applying pressure in a state where the projecting direction of the projection in the projection/recess part is set toward the other element, the pressure applied to the first and second elements is relaxed by the elasticity of the resin part.

According to an embodiment of the present invention, there is provided a second semiconductor device including a first element and a second element adhered to each other. At least one of the first and second elements has a semiconductor part and a resin part.

In the second semiconductor device of the embodiment of the present invention, at least one of the first and second elements adhered to each other is provided with a semiconductor part and a resin part. With the configuration, for example, at the time of adhering the first and second elements while applying pressure in a state where the first and second elements are disposed so as to face each other, the pressure applied to the first and second elements is relaxed by the elasticity of the resin part.

According to an embodiment of the present invention, there is provided a method of manufacturing the first semiconductor device including the steps of preparing a first element and a second element at least one of which has, on its one of faces, a pressure relaxation layer including a semiconductor part having a projection/recess part and a resin part filled in a recess in the projection/recess part, and adhering the first and second elements to each other by applying pressure in a state where projecting direction of the projection in the projection/recess part is set toward the other element.

In the method of manufacturing the first semiconductor device of the embodiment of the present invention, at least one of the first and second elements is provided with, on the adhesion side, the pressure relaxation layer including a semiconductor part having a projection/recess part and a resin part filled in a recess in the projection/recess part. Therefore, the pressure applied to the first and second elements is relaxed by the elasticity of the resin part.

According to an embodiment of the present invention, there is provided a method of manufacturing the second semiconductor device including a step of adhering first and second elements at least one of which has a semiconductor part and a resin part to each other while applying pressure in a state where the first and second elements are disposed so as to face each other.

In the method of manufacturing the second semiconductor device of the embodiment of the present invention, at least one of the first and second elements is provided with the semiconductor part and the resin part, so that the pressure applied to the first and second elements is relaxed by the elasticity of the resin part.

In the first and second semiconductor devices of the embodiment of the present invention, at the time of adhering the first and second elements to each other in the manufacturing process, the pressure applied to the first and second elements may be relaxed by the elasticity of the resin part. Also in the case where large pressure is applied to the first and second elements, an excessive amount of the pressure is lessened by the resin part. Therefore, occurrence of a defect such as a crack may be reduced at the time of adhering the elements to each other.

By the method of manufacturing the first and second semiconductor devices of the embodiment of the present invention, the pressure applied to the first and second elements may be relaxed by the elasticity of the resin part. Also in the case where large pressure is applied to the first and second elements, an excessive amount of the pressure is lessened by the resin part. Therefore, occurrence of a defect such as a crack may be reduced at the time of adhering the elements to each other.

Other and further objects, features and advantages of the invention will appear more fully from the following description.

DETAILED DESCRIPTION OF THE PREFERRED EMBODIMENTS

Embodiments of the present invention will be described hereinbelow with reference to the drawings.

First Embodiment

Figure 1:
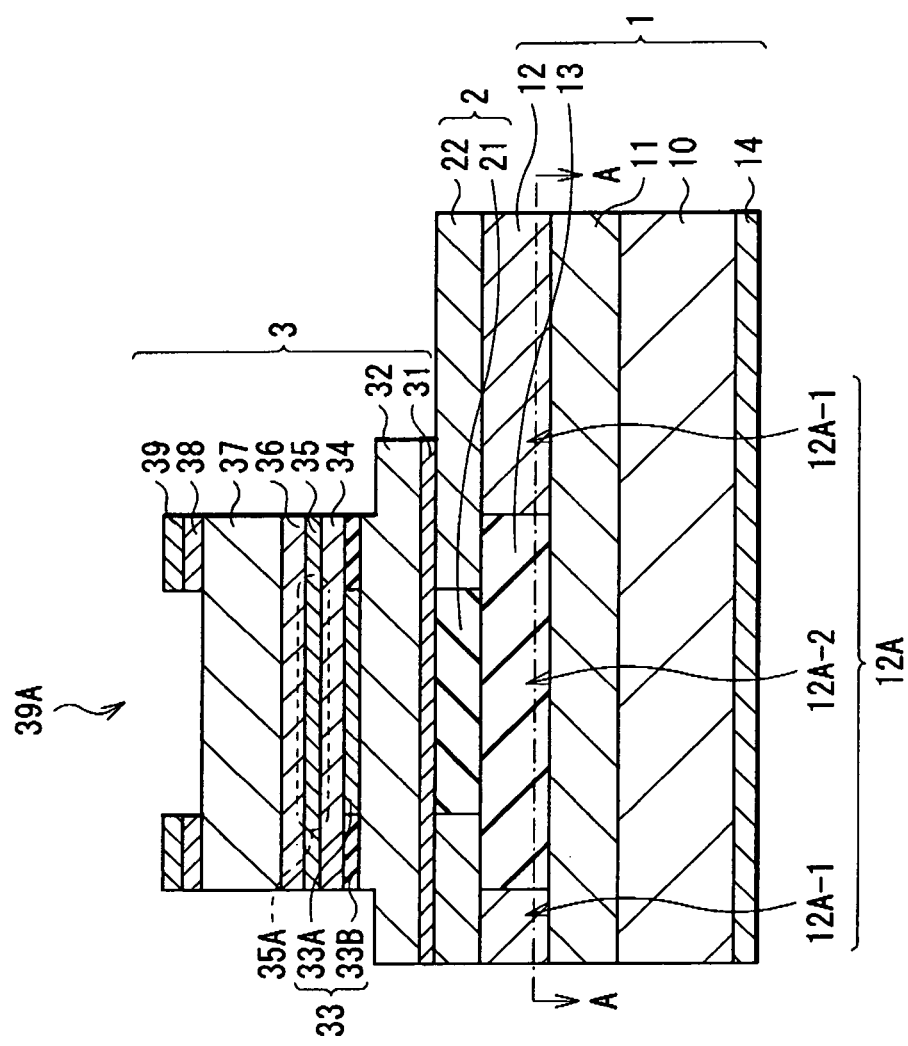
FIG. 1 is a sectional configuration diagram of a semiconductor light emitting device as a first embodiment of the invention.
Figure 2:
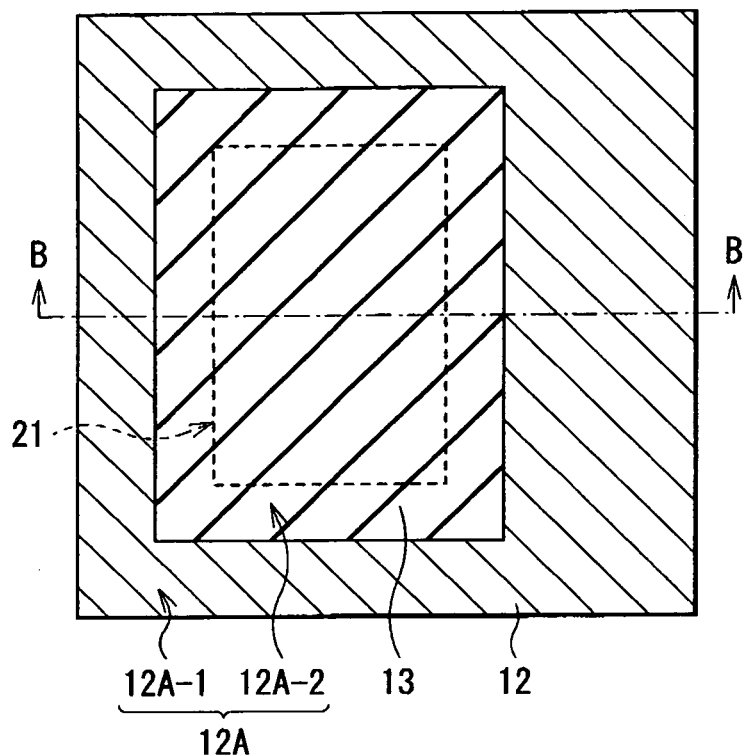
FIG. 2 is a cross section showing an example of a sectional configuration taken along line A-A of FIG. 1.
Figure 3:
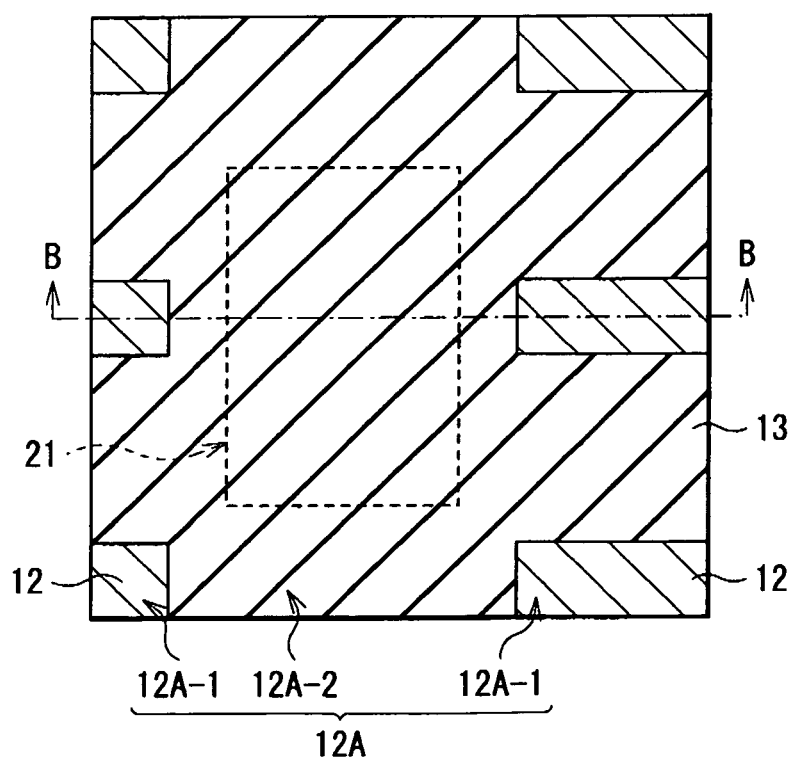
FIG. 3 is a cross section showing another example of the sectional configuration taken along line A-A of FIG. 1.

FIG. 1 shows a sectional configuration of a semiconductor light emitting device as a first embodiment of the present invention. FIG. 2 shows a sectional configuration taken along line A-A of FIG. 1. FIG. 1 corresponds to a sectional configuration taken along line B-B of FIG. 2 or 3. FIGS. 1 to 3 are schematic diagrams, and dimensions and shapes are different from actual ones. The semiconductor light emitting device is constructed by disposing, on a light detecting element 1, a control layer 2 and a vertical cavity surface emitting laser (VCSEL) 3 in order. The light detecting element 1, the control layer 2, and the VCSEL 3 are integrally formed.

In the semiconductor light emitting device, light of the VCSEL 3 is emitted from an aperture 39A (which will be described later) to the outside and is slightly output to the light detecting element 1 via the control layer 2. Specifically, in the semiconductor light emitting device, the control layer 2 and the light detecting element 1 are stacked in this order on the VCSEL 3 on the side opposite to the side where the light of the VCSEL 3 is emitted to the outside. An electric signal (photocurrent) according to the output level of light leaked to the light detecting element 1 side is output from the light detecting element 1.

VCSEL 3

The VCSEL 3 has a stack structure in which, for example, a p-type contact layer 31, a p-type DBR layer 32, a current confinement layer 33, a p-type cladding layer 34, an active layer 35, an n-type cladding layer 36, an n-type DBR layer 37, and an n-type contact layer 38 are stacked in order on the control layer 2. The stack structure has, for example, a mesa shape including steps in the p-type DBR layer 32.

The p-type contact layer 31 is made of, for example, p-type $Al_{x1}Ga_{1-x1}As$ ($0 \leq x1 \leq 1$). Examples of p-type impurity are zinc (Zn), magnesium (Mg), beryllium (Be), and carbon (C).

The p-type DBR layer 32 is constructed by alternately stacking a low-refractive-index layer (not shown) and a high-refractive-index layer (not shown). The low-refractive-index layer is made of, for example, p-type $Al_{x2}Ga_{1-x2}As$ ($0<x2\leqq1$) having a thickness of $\lambda o/4n_1$ ($n_1$ denotes refractive index), and the high-refractive-index layer is made of, for example, p-type $Al_{x3}Ga_{1-x3}As$ ($0\leqq x3<x2$) having a thickness of $\lambda o/4n_2$ ($n_2$ denotes refractive index).

The current confinement layer 33 has a current confinement area 33B in its outer edge area and a current injection area 33A in its center area. The current injection area 33A is made of, for example, p-type $Al_{x4}Ga_{1-x4}As$ ($0<x4\leqq1$). The current confinement area 33B is made of, for example, a material containing $Al_2O_3$ (aluminum oxide) and, as will be described later, is obtained by oxidizing Al of high density included in a current confinement layer 33D from the side face. Therefore, the current confinement layer 33 has the function of confining current.

The p-type cladding layer 34 is made of, for example, p-type $Al_{x5}Ga_{1-x5}As$ ($0\leqq x5\leqq1$). The active layer 35 is made of, for example, undoped $Al_{x6}Ga_{1-x6}As$ ($0\leqq x6\leqq1$). In the active layer 35, an area facing the current injection area 33A is a light emission area 35A. The n-type cladding layer 36 is made of, for example, n-type $Al_{x7}Ga_{1-x7}As$ ($0\leqq x7\leqq1$).

The n-type DBR layer 37 is formed by alternately stacking a low-refractive-index layer (not shown) and a high-refractive-index layer (not shown). The low-refractive-index layer is made of, for example, n-type $Al_{x8}Ga_{1-x8}As$ ($0<x8\leqq1$) having a thickness of $\lambda o/4n_3$ ($n_3$ denotes refractive index), and the high-refractive-index layer is made of, for example, n-type $Al_{x9}Ga_{1-x9}As$ ($0\leqq x9<x8$) having a thickness of $\lambda o/4n_4$ ($n_4$ denotes refractive index).

The n-type contact layer 38 is made of, for example, n-type $Al_{x10}Ga_{1-x10}As$ ($0\leqq x10\leqq1$). The n-type contact layer 38 has, for example, an aperture corresponding to the light emission area 35A and has a donut shape.

The VCSEL 3 also includes an n-side electrode 39 on the n-type contact layer 38. The n-side electrode 39 has a structure obtained by stacking, for example, an alloy of gold (Au) and germanium (Ge), nickel (Ni), and gold (Au) in order from the n-type contact layer 38 side, and is electrically connected to the n-type contact layer 38. The n-side electrode 39 has, for example, the aperture 39A in correspondence with the light emission area 35A and has a donut shape.

Control Layer 2

The control layer 2 has a light transmitting part 21 and a metal part 22 in the same plane. The light transmitting part 21 is provided at least in a part of an area facing the light emission area 35A in the VCSEL 3. The metal part 22 is provided around the light transmitting part 21. In the relation with light emitted from the VCSEL 3, it is said that the metal part 22 has an aperture at least in a part of the area facing the light emission area 35A. FIG. 1 shows the case where the light transmitting part 21 is provided in the whole area facing the light emission area 35A.

The light transmitting part 21 is made of a material capable of transmitting light emitted from the light emission area 35A, for example, an insulting material such as SiN, $SiO_2$ or air. The light transmitting part 21 transmits light released to the light detecting element 1 side in the light emitted from the light emission area 35A. On the other hand, the metal part 22 is made of a metal having high reflectance, for example, gold (Au) or the like. The metal part 22 reflects the light emitted to an area other than the light transmitting part 21 in the light emitted to the light detecting element 1 side toward the VCSEL 3 side, thereby interrupting entrance to the light detecting element 1. That is, the control layer 2 has not only the function of joining the light detecting element 1 and the VCSEL 3 to each other but also the function of regulating the incidence area of light to the light detecting element 1. The metal part 22 is electrically connected to the p-type contact layer 31 in the VCSEL 3 and also functions as the p-side electrode of the VCSEL 3.

Preferably, the control layer 2 is formed, for example, according to a manufacturing method which will be described later. At the time of overlapping the light detecting element 1 and the VCSEL 3, a control layer 2A having a light transmitting part 21A and a metal part 22A and formed on the surface of the light detecting element 1 and a control layer 2B having a light transmitting part 21B and a metal part 22B and formed on the surface of the VCSEL 3 are joined to each other.

In this case, by joining the light transmitting parts 21A and 21B to each other, the light transmitting part 21 is formed. By joining the metal parts 22A and 22B, the metal part 22 is formed. The control layer 2 may be formed in advance on the surface of either the light detecting element 1 or the VCSEL 3 at the time of overlapping the light detecting element 1 and the VCSEL 3.

Light Detecting Element 1

The light detecting element 1 has, on a substrate 10, a light absorption layer 11, a p-type semiconductor part 12, and a resin part 13 in order from the substrate 10 side and has, on the back side of the substrate 10, an n-side electrode 14. The p-type semiconductor part 12 and the resin part 13 are formed in the same plane.

The substrate 10 is made of, for example, n-type GaAs. The light absorption layer 11 is made of, for example, $Al_{x11}Ga_{1-x11}As$ ($0\leqq x11\leqq1$) and is provided at least in an area facing the light transmitting part 21. With the configuration, the light absorption layer 11 absorbs part of light output from the light emission area 35A and converts the absorbed light to an electric signal. The electric signal is input as a light output monitor signal to a light output computing circuit (not shown) connected to the light detecting element 1, and used for measuring the output level of light passed through the control layer 2 in the light output computing circuit.

The p-type contact part 12 is made of, for example, p-type $Al_{x12}Ga_{1-x12}As$ ($0\leqq x12\leqq1$). High-concentration p-type impurity may be doped only in an upper part of the p-type semiconductor part 12. The p-type semiconductor part 12 has, in a stack plane, a projection/recess part 12A including one or more projections 12A-1 and one or more recesses 12A-2. The projection 12A-1 projects toward the VCSEL 3 (on the side of the VCSEL 3, of the p-type semiconductor part 12).

Preferably, the projection/recess part 12A is provided on the side of the surface facing the VCSEL 3, and the height of the projection 12A-1 (the depth of the recess 12A-2) is 1 μm or greater. In this case, elasticity of the resin part 13 may be used more effectively in an adhering process which will be described later. Preferably, the projection 12A-1 has conductivity and is electrically connected to the metal part 22. In this case, the metal part 22 can be used as a p-side electrode of the light detecting element 1.

The recess 12A-2 is filled with the resin part 13. The resin part 13 is made of a resin material having a property of transmitting light emitted from the VCSEL 3 such as polyimide. Generally, resin material has elasticity higher than that of semiconductor material and thermal conductivity lower than that of semiconductor material. Preferably, the recess 12A-2 is provided at least in an area facing the light transmitting part 21. In this case, the light passed through the light transmitting part 21 in the light emitted from the VCSEL 3 is led to the light absorption layer 11 while suppressing attenuation of the light as much as possible.

The recess 12A-2 may be a dent or groove formed in the surface on the control layer 2 side of the p-type semiconductor part 12 or a hole penetrating the p-type semiconductor part 12 as shown in FIG. 1. In the case where the recess 12A-2 is a hole, as shown in FIG. 1, the light absorption layer 11 is exposed from the bottom of the recess 12A-2.

The n-side electrode 14 has a structure in which, for example, an AuGe alloy, Ni, and Au are stacked in order from the substrate 10 side, and is electrically connected to the substrate 10.

The semiconductor light emitting device having such a configuration is manufactured as follows. FIGS. 4A and 4B to FIGS. 11A and 11B show the manufacturing method in the process order.

Figure 4A:
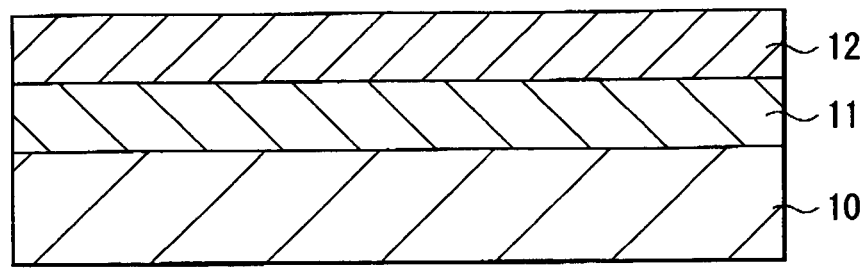
FIGS. 4A and 4B are cross sections illustrating a manufacturing process of the semiconductor light emitting device.
Figure 4B:
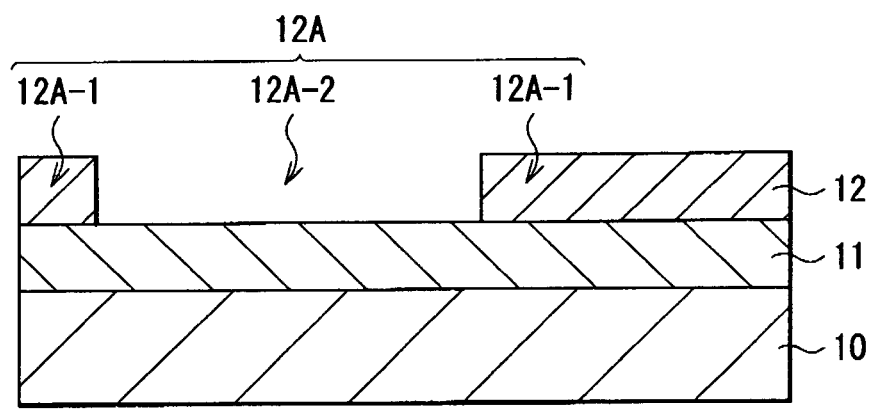

First, on the substrate 10, the light absorption layer 11 and the p-type semiconductor part 12 are stacked in this order (FIG. 4A). Subsequently, a photoresist (not shown) is formed in an area including the area facing an area where the metal part 22 is to be formed. Using the photoresist as a mask, the p-type semiconductor part 12 is selectively removed by, for example, dry etching to expose a part of the light absorption layer 11 (FIG. 4B). As a result, the projection/recess part 12A including the projections 12A-1 and the recess 12A-2 is formed in the p-type semiconductor part 12. After that, the mask is removed.

Figure 5:
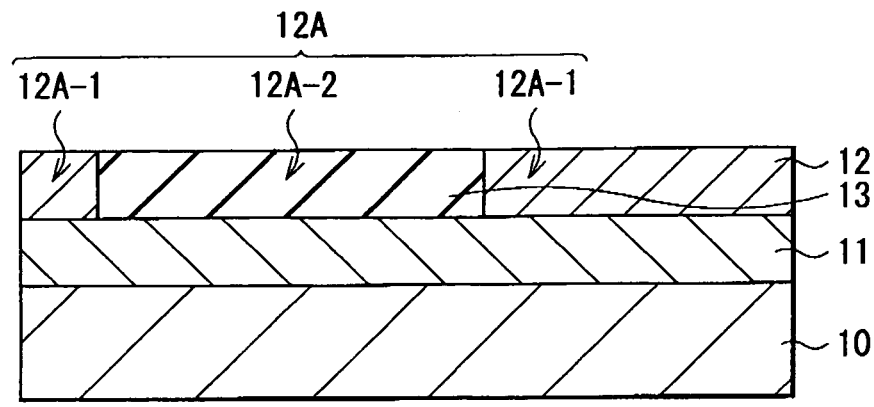
FIG. 5 is a cross section illustrating a process subsequent to FIG. 4B.

The recess 12A-2 is filled with a resin such as polyimide to thereby forming the resin part 13 (FIG. 5). At this time, the height of the resin part 13 is set to be equal to or higher than that of the projection 12A-1.

Figure 6:
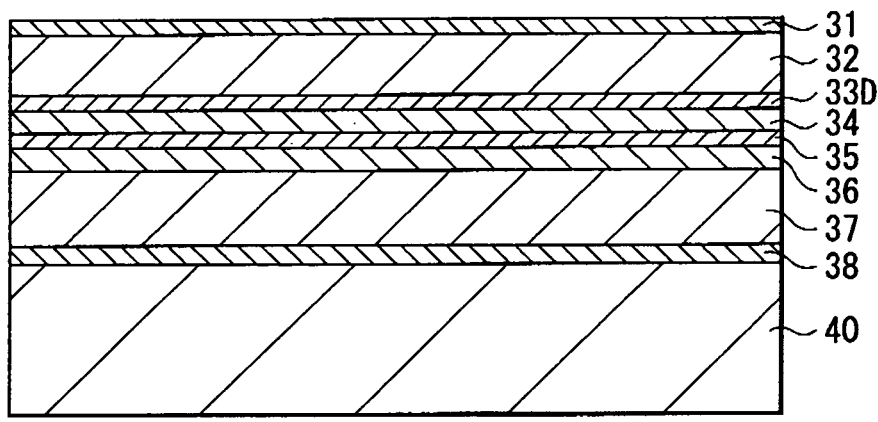
FIG. 6 is a cross section illustrating a process subsequent to FIG. 5.

Next, on a substrate 40 made of, for example, n-type GaAs, the n-type contact layer 38, the n-type DBR layer 37, the n-type cladding layer 36, the active layer 35, the p-type cladding layer 34, the current confinement layer 33D, the p-type DBR layer 32, and the p-type contact layer 31 are stacked in this order (FIG. 6).

Figure 7A:
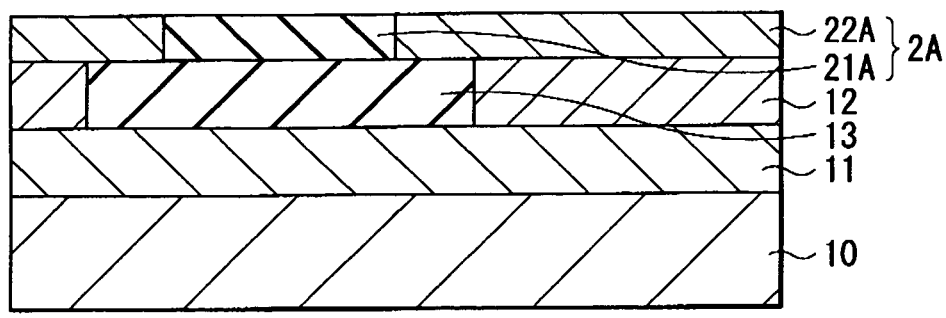
FIGS. 7A and 7B are cross sections illustrating a process subsequent to FIG. 6.
Figure 7B:
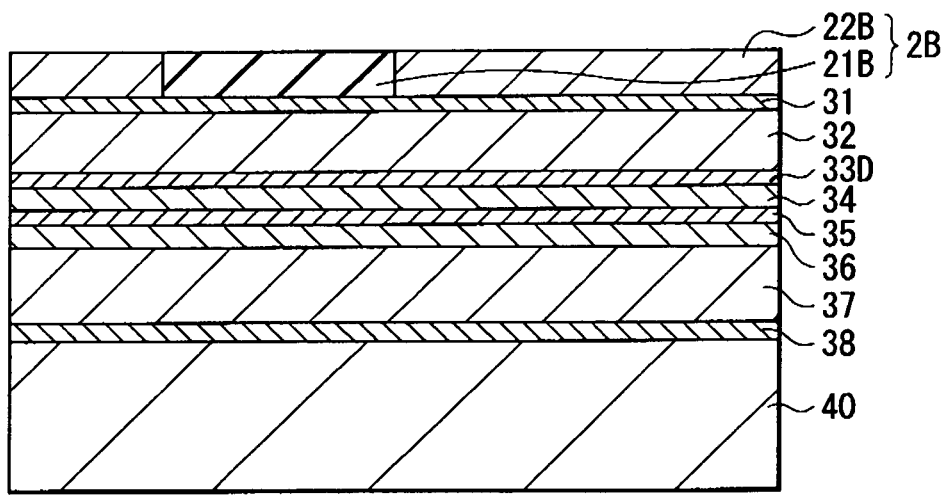

An insulating material such as SiO$_2$ is deposited on the p-type semiconductor part 12, the resin part 13, and the p-type contact layer 31, and a photoresist (not shown) is formed in an area corresponding to the light emission area 35A in the surface of the deposited insulating material. Subsequently, the photoresist is used as a mask and the insulating material is selectively removed by, for example, wet etching using a hydrofluoric acid etchant, thereby forming the light transmitting parts 21A and 21B. A metal such as gold (Au) is deposited by the vacuum evaporation method and the photoresist is removed, thereby forming the metal parts 22A and 22B. In such a manner, the control layers 2A and 2B are formed (FIGS. 7A and 7B).

Figure 8:
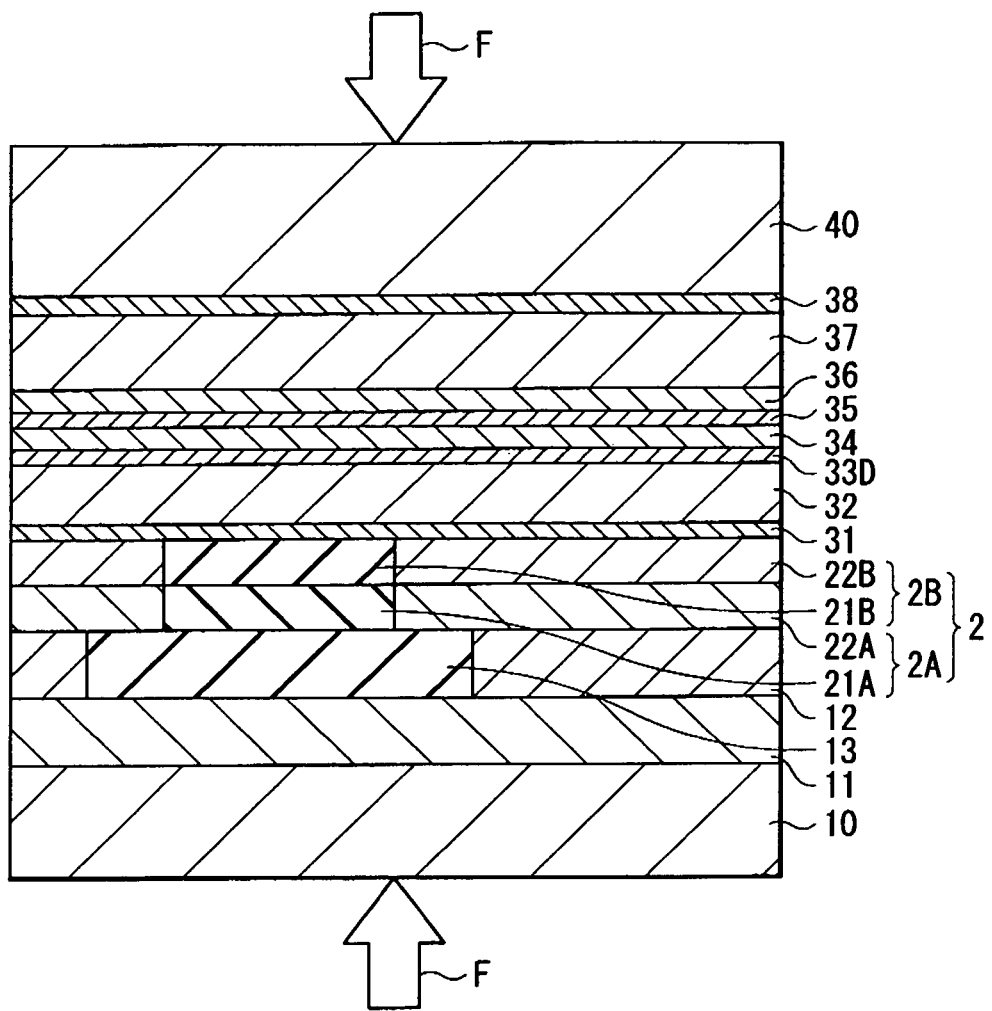
FIG. 8 is a cross section illustrating a process subsequent to FIG. 7B.
Figure 9:
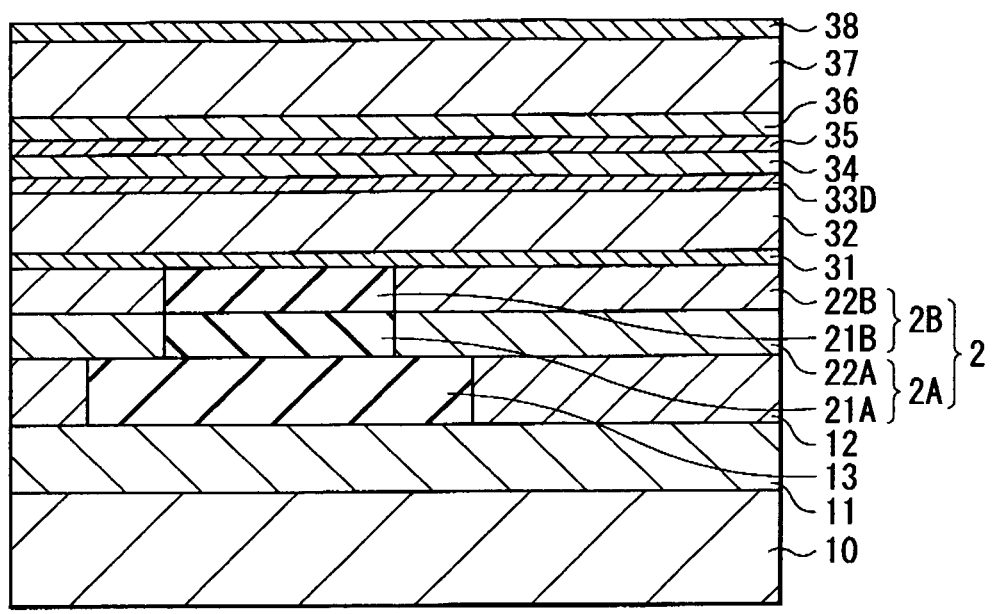
FIG. 9 is a cross section illustrating a process subsequent to FIG. 8.

The control layers 2A and 2B are set so as to face each other. In a state where the projection direction of the projections 12A-1 is set toward the control layer 2B and the temperature is set to be high, the control layers 2A and 2B are adhered to each other while applying a pressure F from the substrates 10 and 40 sides (FIG. 8). As a result, the control layer 2 is formed, and the substrates 10 and 40 are adhered to each other with the control layer 2 in between. After that, the substrate 40 is removed by, for example, wet etching (FIG. 9).

Figure 10A:
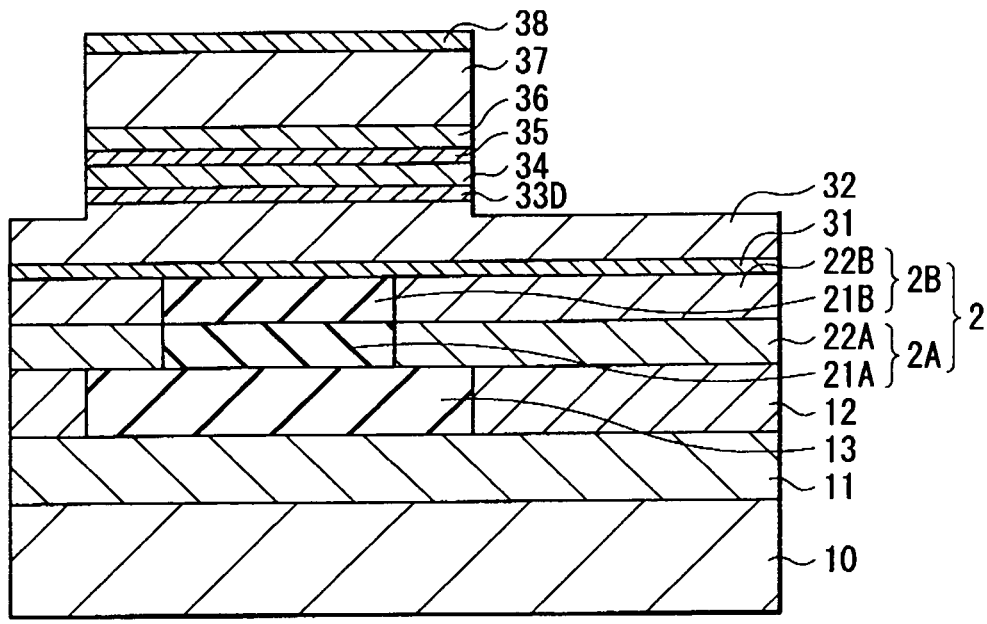
FIGS. 10A and 10B are cross sections illustrating a process subsequent to FIG. 9.

Next, a mask (not shown) is formed in a predetermined area in the surface of the n-type contact layer 38. The n-type contact layer 38, the n-type DBR layer 37, the n-type cladding layer 36, the active layer 35, the p-type cladding layer 34, the current confinement layer 33D, and a part of the p-type DBR layer 32 are selectively removed by, for example, dry etching, thereby forming a mesa shape. After that, the mask is removed (FIG. 10A). At this time, a part of the p-type DBR layer 32 is exposed.

Figure 10B:
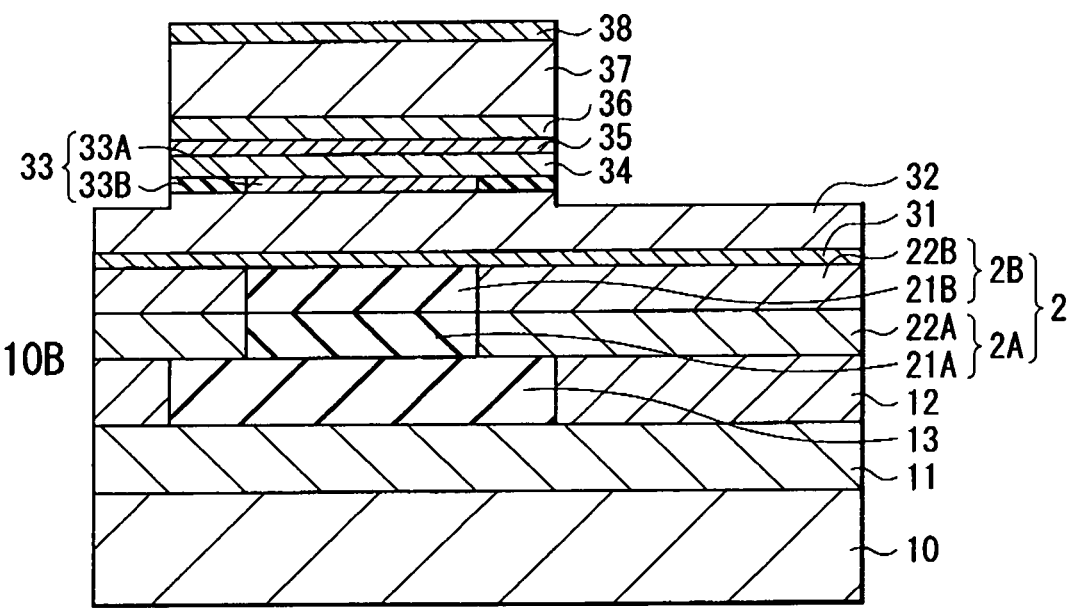

An oxidizing process is performed at high temperature in the vapor atmosphere to selectively oxidize the current confinement layer 33D from the side face of the mesa. By the operation, the outer peripheral area of the current confinement layer 33D becomes an insulating layer (aluminum oxide). As a result, the current confinement area 33B is formed in the outer peripheral area, and the center area becomes the current injection area 33A. In such a manner, the current confinement layer 33 is formed (FIG. 10B).

Figure 11A:
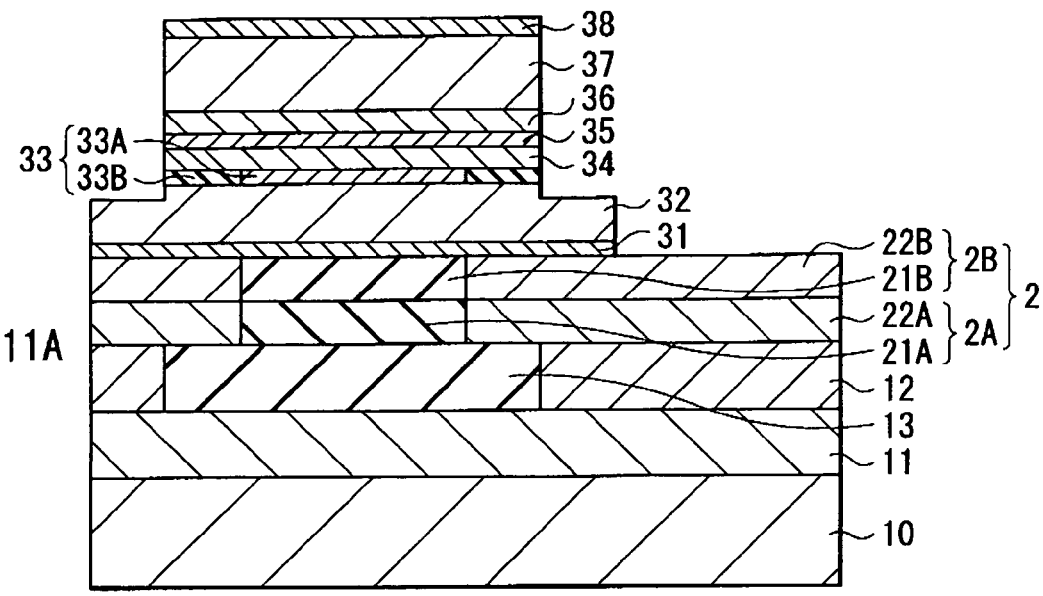
FIGS. 11A and 11B are cross sections illustrating a process subsequent to FIG. 10B.
Figure 11B:
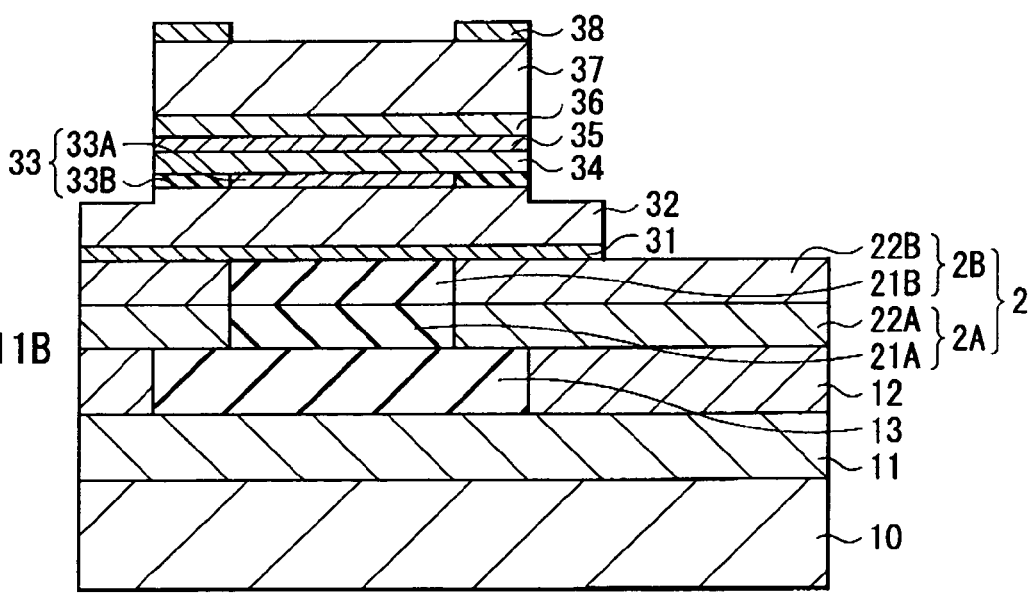

In a manner similar to the above, the exposed portion in the p-type DBR layer 32 and the p-type contact layer 31 are selectively removed (FIG. 11A), thereby forming a mesa shape having a step in some midpoint of the p-type DBR layer 32 and exposing a part of the metal part 22. Subsequently, a mask (not shown) having an aperture in a center portion of the top face of the mesa is formed. For example, by wet etching, an aperture is formed in the n-type contact layer 38. After that, the mask is removed (FIG. 11B).

Next, for example, by evaporation, the n-side electrode 39 having the aperture 39A is formed on the surface of the n-type contact layer 38 and, further, the n-side electrode 14 is formed on the back side of the substrate 10 (FIG. 1). In such a manner, the semiconductor light emitting device of the embodiment is manufactured.

Figure 12:
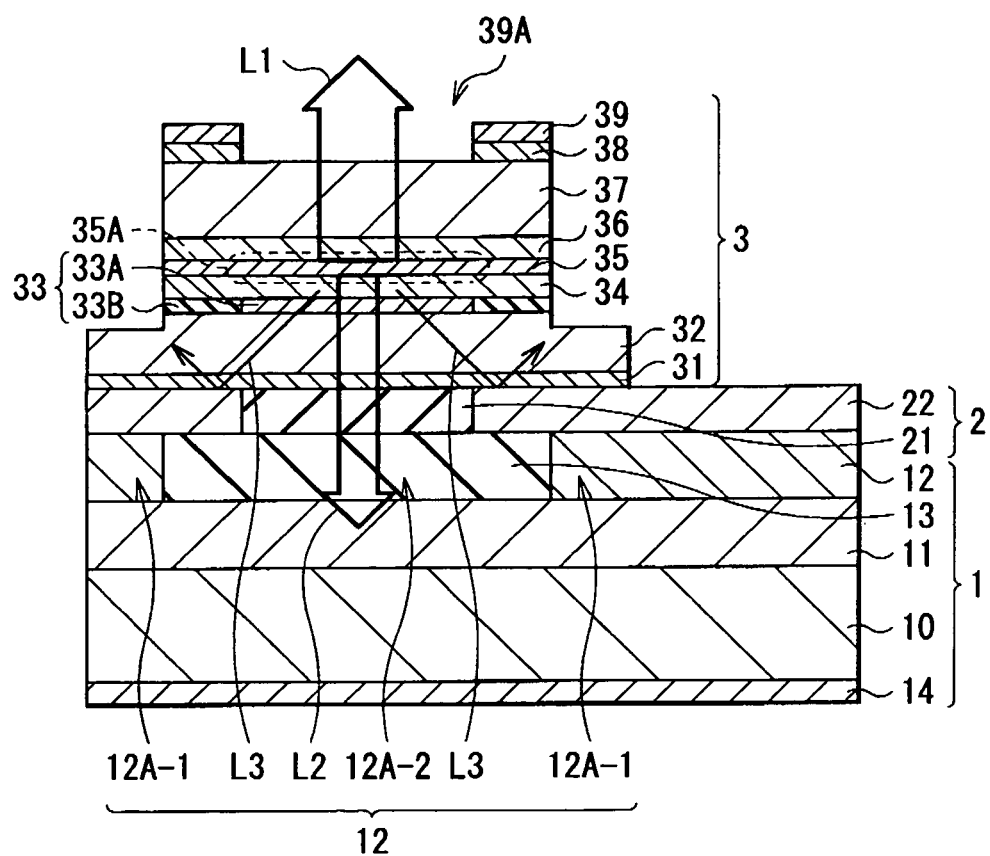
FIG. 12 is a cross section illustrating the operation of the semiconductor light emitting device.

In the semiconductor light emitting device of the embodiment, when a predetermined voltage is applied across the metal part 22 as a p-side electrode and the n-side electrode 39, the current narrowed by the current confinement layer 33 is injected to the light emission area 35A as a gain area in the active layer 35. As a result, light is generated by recombination of electrons and positive holes. The light includes not only light generated by stimulated emission but also light generated by spontaneous emission. As a result of repetition of stimulated emission in the device, a laser oscillation occurs at a predetermined wavelength $\lambda o$. Light L1 including the wavelength $\lambda o$ is output to the outside, and light L2 including the wavelength $\lambda o$ is output to the light detecting element 1 side (FIG. 12).

Since the light absorption layer 11 in the light detecting element 1 is disposed in correspondence with the light emission area 35A, the light L2 passes through the light transmitting part 21 and the resin part 13 and is incident on the light absorption layer 11. A part of the light L2 incident on the light absorption layer 11 is absorbed by the light absorption layer 11 and converted to an electric signal (photocurrent) according to the output level of the absorbed light. The electric signal has intensity according to the output level of light output from the VCSEL 3 to the outside. The electric signal is output to a light output computing circuit (not shown) via a wire (not shown) electrically connected to the metal part 22 as the p-side electrode and the n-side electrode 14 and then received as a light output monitor signal in the light output computing circuit. In such a manner, the output level of the light output from the VCSEL 3 to the outside is measured.

Most of the spontaneous emission light (light L2) output to the light detecting element 1 side passes through the light transmitting part 21 and the resin part 13 and enter the light detecting element 1. On the other hand, most of the spontaneous emission light (light L3) output to the light detecting element 1 side is reflected by the metal part 22 toward the VCSEL 3 side, and incidence to the light detecting element 1 is interrupted for the following reason. The stimulated emission light has directivity and is hardly released to the metal part 22 side. Meanwhile, the spontaneous emission light does not have directivity and most of it is released to the metal part 22 side. Consequently, the amount of the spontaneous emission light passing through the light transmitting part 21 is made much smaller than that of the stimulated emission light passing through the light transmitting part 21. Since the reflectance of the metal part 22 is usually extremely high, the amount of the spontaneous emission light passing through the metal part 22 is ignorable as compared with the amount of the spontaneous emission light passing through the light transmitting part 21.

Therefore, in the semiconductor light emitting device of the embodiment, the control layer 2 having the light transmitting part 21 and the metal part 22 is provided between the VCSEL 3 and the light detecting element 1, so that entry of the spontaneous emission light released to the control layer 2 side to the light detecting element 1 is substantially interrupted. As a result, the detection level of the spontaneous emission light by the light detecting element 1 is lowered, so that light detection precision is further improved.

In the embodiment, the resin part 13 is provided near the control layer 2 adhering the light detecting element 1 and the VCSEL 3. The resin part 13 is made of a resin material having elasticity higher than that of a semiconductor material. Consequently, in the process of adhering the light detecting element 1 and the VCSEL 3, the pressure F applied to the elements is relaxed by the elasticity of the resin part 13. Even in the case where the pressure F is high, an excessive amount of the pressure is lessened by the resin part 13. Therefore, occurrence of a defect such as a crack is reduced at the time of adhering the light detecting element 1 and the VCSEL 3.

In the embodiment, the resin part 13 is made of a resin material having thermal conductivity lower than that of the semiconductor material. By properly adjusting the position and the shape of the recess 12A-2, the area ratio between the projection 12A-1 and the recess 12A-2, the kind of the resin material, and the like, for example, in a process of mounting the semiconductor light emitting device on a sub-mount, a heat sink, a can, or the like via a solder, the resin part 13 suppresses rapid conduction of heat from the light detecting element 1 side to the VCSEL 3 side. It eliminates the possibility that the VCSEL 3 is heated excessively. Thus, heat resistance of the semiconductor light emitting device is increased.

Since the p-type semiconductor part 12 (the projection 12A-1) contains the p-type impurity and the substrate 10 contains the n-type impurity, they have conductivity. Further, the p-type semiconductor part 12 (the projection 12A-1) is electrically connected to the metal part 22, and the substrate 10 is electrically connected to the n-side electrode. With the configuration, an electric signal converted by the light absorption layer 11 may be taken from the metal part 22 and the n-side electrode 14. That is, the metal part 22 has not only the function of suppressing entry of the spontaneous emission light to the light detecting element 1 but also the function of the p-side electrode of the light detecting element 1. Therefore, it is unnecessary to provide a p-side electrode for the light detecting element 1. The metal part 22 is electrically connected also to the p-type contact layer 31 of the VCSEL 3. That is, since the metal part 22 also functions as the p-side electrode of the VCSEL 3, it is unnecessary to provide a p-side electrode for the VCSEL 3.

Since the control layer 2 is formed by using a technique of extremely high process precision such as photolithography, as compared with the case of forming an oxidation layer that disturbs transmission of the spontaneous emission light by oxidizing a part of the semiconductor layer by using an oxidation process whose controllability is not easy like Japanese Patent No. 2,877,785, the shape, size, and the like is obtainable with higher precision. Therefore, variations in the properties of semiconductor light emitting devices may be reduced largely.

It is also unnecessary to use a process causing volume shrinkage such as oxidation of a semiconductor layer like in Japanese Patent No. 2,877,785 or the like in order to eliminate the spontaneous emission light. There is consequently no possibility that peeling caused by volume shrinkage occurs in the control layer 2. Thus, the yield and reliability is much higher than that in the case of forming a layer for eliminating the spontaneous emission light by using the process accompanying volume shrinkage such as oxidation of a semiconductor layer.

Since the metal parts 22A and 22B are joined to each other, adhesion between the light detecting element 1 and the VCSEL 3 may be increased. Since the joined parts do not peel from each other, it is not feared that the yield and reliability deteriorates due to the joining.

Figure 13:
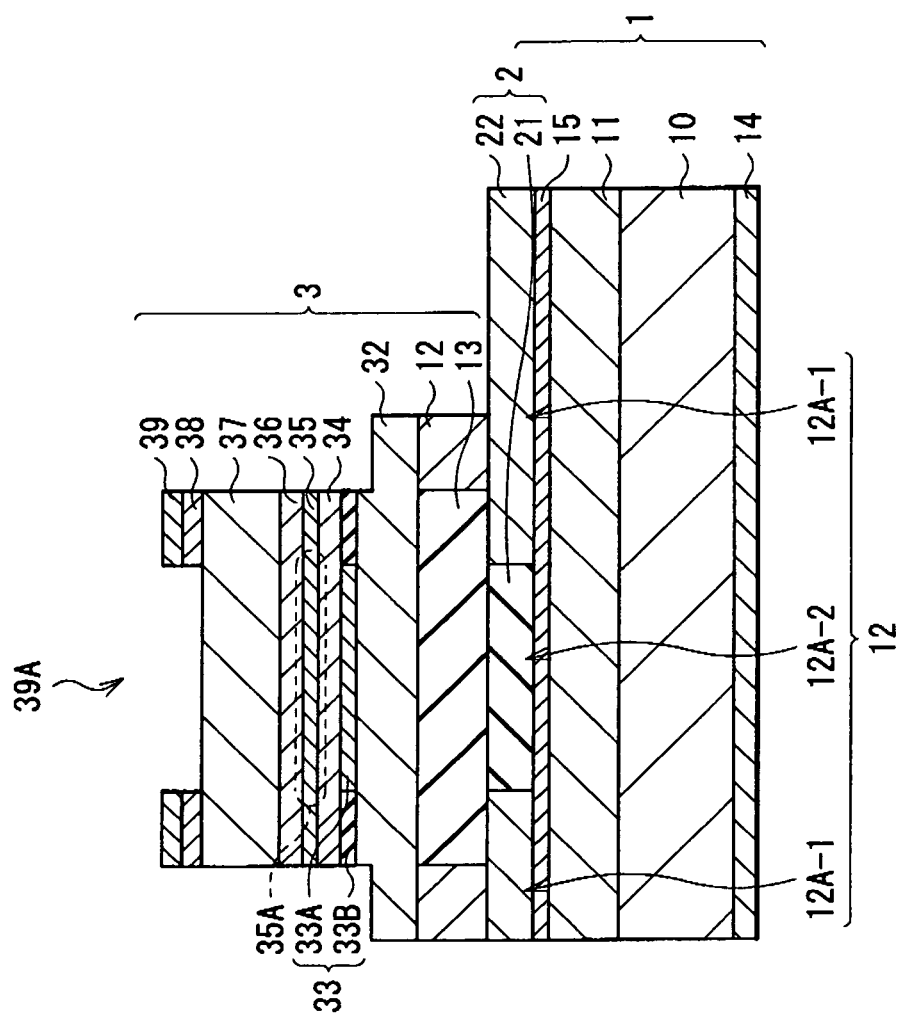
FIG. 13 is a sectional configuration diagram of a semiconductor light emitting device as a modification.
Figure 14:
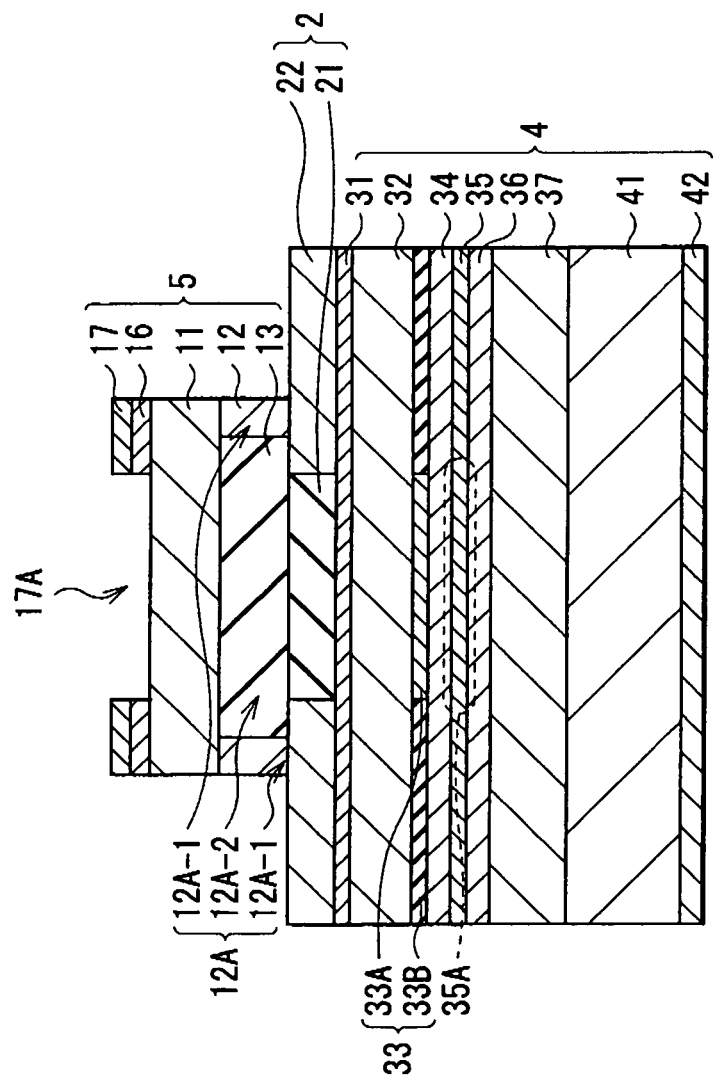
FIG. 14 is a sectional configuration diagram of a semiconductor light emitting device as a second embodiment of the present invention.

Since the light detecting element 1 and the VCSEL 3 are crystal-grown on different substrates, as compared with the case where they are formed on the same substrate, crystal growth may be performed at higher quality. As a result, the device properties and reliability are further improved.
Modification of First Embodiment In the foregoing embodiment, the p-type semiconductor part 12 and the resin part 13 are provided on the light detecting element 1 side. Alternately, they may be provided on the VCSEL 3 side, as shown in FIG. 13. Also in the case of providing the resin part 13 on the VCSEL 3 side, effects similar to those of the foregoing embodiment are produced. In this case, it is preferable to provide the p-type contact layer 15 between the contact layer 2 and the light absorption layer 11.
Second Embodiment FIG. 14 shows the structure of a semiconductor light emitting device as a second embodiment of the present invention. FIG. 14 is a schematic diagram and dimensions and shapes in FIG. 14 are different from actual ones. In the following description, when the same reference numeral as that in the foregoing embodiment is used, it means that the component has the configuration and function similar to those of the component having the same reference numeral.

The semiconductor light emitting device is formed by disposing the control layer 2 and a light detecting element 5 in order on a VCSEL 4 and integrally forming the VCSEL 4, the control layer 2, and the light detecting element 5. In the semiconductor light emitting device, light emitted from the VCSEL 4 goes out via the control layer 2 and the light detecting element 5 from an aperture 17A (which will be described later) to the outside. Further, an electric signal according to the output level of light entering the light detecting element 5 is output from the light detecting element 5.

Specifically, in the semiconductor light emitting device, the control layer 2 and the light detecting element 5 are disposed in this order on the side where light emitted from the VCSEL 4 mainly goes out to the outside. The positions of the control layer 2 and the light detecting element 5 relative to the VCSEL 4 are mainly different from those of the foregoing embodiment. In the following, the different point will be mainly described in detail, and the description of the configurations, operations, and effects similar to those of the foregoing embodiment will not be repeated.
VCSEL 4

The VCSEL 4 has a stack structure in which the n-type DBR layer 37, the n-type cladding layer 36, the active layer 35, the p-type cladding layer 34, the current confinement layer 33, the p-type DBR layer 32, and the p-type contact layer 31 are stacked in order on the surface of a substrate 41. An n-side electrode 42 is formed on the back side of the substrate 41. The substrate 41 is made of, for example, n-type GaAs. The n-side electrode 42 has a structure in which, for example, an AuGe alloy, Ni, and Au are stacked in order from the substrate 40 side and is electrically connected to the substrate 41.

Light Detecting Element 5

The light detecting element 5 has, on the control layer 2, the p-type semiconductor part 12 and the resin part 13 formed in the same plane, the light absorption layer 11, the n-type contact layer 16, and the n-side electrode 17 in order from the control layer 2 side. The n-type contact layer 16 is made of, for example, n-type $Al_{x12}Ga_{1-x12}As$ ($0 \leqq x12 \leqq 1$). The n-type contact layer 16 has, for example, an aperture in correspondence with the light emission area 35A and has a donut shape. The n-side electrode 17 has a stack structure in which an AuGe alloy, Ni, and Au are stacked in order from the control layer 2 side, and is electrically connected to the substrate 41. The n-side electrode 17 has, for example, the aperture 17A in correspondence with the light emission area 35A and has a donut shape.

In the semiconductor light emitting device of the embodiment, like the foregoing embodiment, the control layer 2 having the light transmitting part 21 and the metal part 22 is provided between the VCSEL 4 and the light detecting element 1, so that entry of the spontaneous emission light released to the control layer 2 side to the light detecting element 1 is substantially interrupted. As a result, the detection level of the spontaneous emission light by the light detecting element 1 may be lowered, so that light detection precision may be further improved.

In the embodiment, like the foregoing embodiment, the resin part 13 is provided near the control layer 2 adhering the light detecting element 1 and the VCSEL 4. Consequently, even in the case where the pressure F is high, an excessive amount of the pressure is lessened by the resin part 13. Therefore, occurrence of a defect such as a crack may be reduced at the time of adhering the light detecting element 1 and the VCSEL 4.

Modification of Second Embodiment

Figure 15:
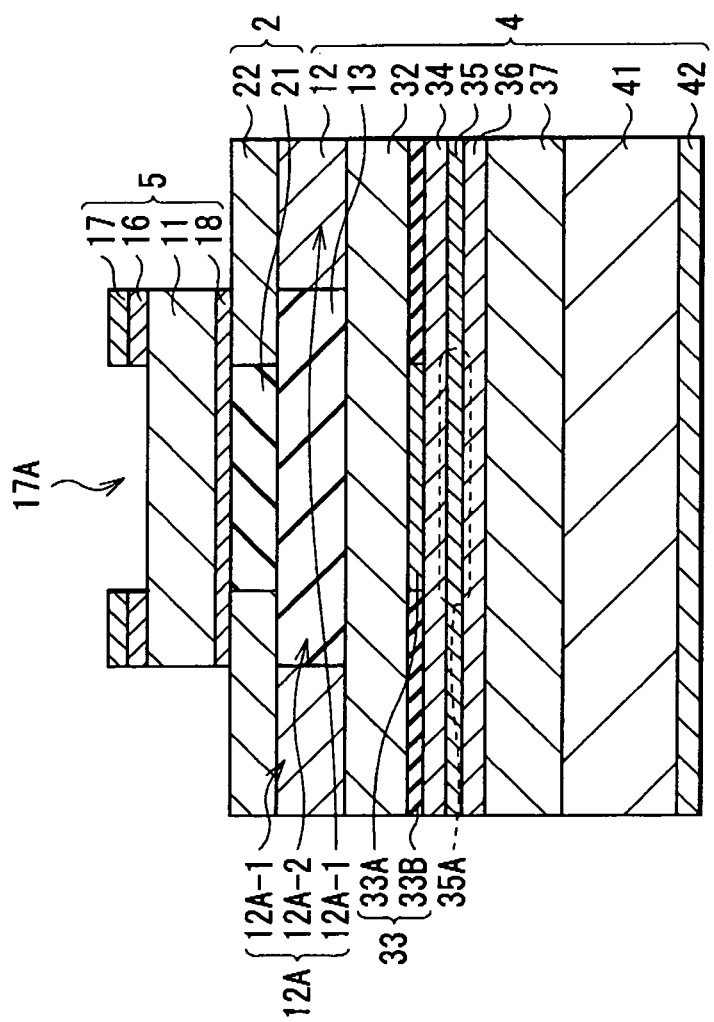
FIG. 15 is a sectional configuration diagram of a semiconductor light emitting device as a modification.

Although the p-side semiconductor part 12 and the resin part 13 are provided on the light detecting element 5 side in the foregoing embodiment, as shown in FIG. 15, they may be provided on the VCSEL 4. As described above, also in the case of providing the resin part 13 on the VCSEL 4 side, effects similar to those of the embodiment are produced. In this case, it is preferable to provide a p-type contact layer 18 between the control layer 2 and the light absorption layer 11.

Although the present invention has been described by the embodiments, the invention is not limited to the embodiments but can be variously modified.

For example, the case of using a GaAs-based compound semiconductor as the semiconductor material has been described in the foregoing embodiments, other materials such as a GaInP-based (red-based) material, an AlGaAs-based (infra-red-based) material, a GaN-based (blue-green-based) material, or the like may be also used.

In the foregoing embodiments, the measures of applying the present invention to the case of integrally forming the surface-emitting semiconductor laser and the light detecting element via the control layer 2 have been described. The invention is also applicable to the case of using another light emitting device such as a light emitting diode in place of the surface-emitting semiconductor laser. The invention is also applicable to the case of using a conductive substrate capable of passing current in the thickness direction in place of a light detecting element.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device comprising:
 a laser configured to radiate a light emission, part of the light emission being transmissible through a light transmitting part of a control layer and a resin part of a projection/recess part;
 a group III-V compound light absorption layer configured to convert said part of the light emission into an electric signal, said control layer and said projection/recess part being between said laser and said light absorption layer.

2. The semiconductor device according to claim 1, wherein said light transmitting part is an insulating material.

3. The semiconductor device according to claim 1, wherein said light absorption layer is made of $Al_{x11}Ga_{1-x11}As$, with $0 \leqq x11 \leqq 1$.

4. The semiconductor device according to claim 1, wherein said light absorption layer is a p-type layer.

5. The semiconductor device according to claim 1, wherein said resin part physically contacts said light transmitting part.

6. The semiconductor device according to claim 1, wherein said control layer is between said laser and said projection/recess part.

7. The semiconductor device according to claim 6, wherein said projection/recess part is between said control layer and said light absorption layer.

8. The semiconductor device according to claim 1, wherein said light transmitting part is between said resin part and said laser.

9. The semiconductor device according to claim 8, wherein said laser physically contacts said light transmitting part.

10. The semiconductor device according to claim 1, wherein said projection/recess part is between said laser and said control layer.

11. The semiconductor device according to claim 10, wherein said control layer is between said projection/recess part and said light absorption layer.

12. The semiconductor device according to claim 1, wherein said resin part is between said light transmitting part and said laser.

13. The semiconductor device according to claim 12, wherein said laser physically contacts said resin part.

14. The semiconductor device according to claim 1, wherein a metal part of the control layer is configured to reflect said light emission.

15. The semiconductor device according to claim 14, wherein said metal part is around said light transmitting part.

16. The semiconductor device according to claim 1, wherein said resin part is a resin material.

17. The semiconductor device according to claim 16, wherein said resin material has elasticity higher than that of semiconductor material, thermal conductivity of resin material being lower than that of said semiconductor material.

18. The semiconductor device according to claim 1, wherein a hole is through a semiconductor part of the projection/recess part, said resin part being in said hole.

19. The semiconductor device according to claim 18, wherein said semiconductor part is a p-type layer.

20. The semiconductor device according to claim 18, wherein said semiconductor part is made of $Al_{x12}Ga_{1-x12}As$ with $0 \leqq x12 \leqq 1$.

21. The semiconductor device according to claim 1, wherein said laser is a vertical cavity surface emitting laser, a first DBR layer of the vertical cavity surface emitting laser being between an active layer of the vertical cavity surface emitting laser and said light absorption layer.

22. The semiconductor device according to claim 21, wherein an active layer is between said first DBR layer and a second DBR layer.

* * * * *